(12) United States Patent
Yang

(10) Patent No.: US 7,187,613 B2
(45) Date of Patent: Mar. 6, 2007

(54) METHOD AND APPARATUS FOR DYNAMICALLY CONFIGURING REDUNDANT AREA OF NON-VOLATILE MEMORY

(75) Inventor: Cheng-Chih Yang, Taipei (TW)

(73) Assignee: Genesys Logic, Inc., Taipei (TW)

( * ) Notice: Subject to any disclaimer, the term of this patent is extended or adjusted under 35 U.S.C. 154(b) by 135 days.

(21) Appl. No.: 10/855,519

(22) Filed: May 28, 2004

(65) Prior Publication Data

US 2005/0002234 A1   Jan. 6, 2005

(30) Foreign Application Priority Data

May 28, 2003   (TW) ................ 92114469 A

(51) Int. Cl.
*G11C 8/00*   (2006.01)

(52) U.S. Cl. .................. 365/230.03; 365/185.09; 365/185.03; 365/189.01

(58) Field of Classification Search ........... 365/230.03, 365/185.09, 185.03, 189.01
See application file for complete search history.

(56) References Cited

U.S. PATENT DOCUMENTS

| 6,879,528 B2 * | 4/2005 | Takeuchi et al. ............ 365/200 |
| 2002/0112197 A1 * | 8/2002 | Yoshino et al. ................ 714/6 |
| 2004/0080985 A1 * | 4/2004 | Chang et al. .......... 365/185.33 |

* cited by examiner

*Primary Examiner*—Van Thu Nguyen
*Assistant Examiner*—N Nguyen
(74) *Attorney, Agent, or Firm*—Rosenberg, Klein & Lee

(57) ABSTRACT

A method and an apparatus for dynamically configuring the redundant areas of a non-volatile memory is provided wherein each page of a memory is configured into a plurality of data areas and a plurality of redundant areas. The redundant areas interleave the data areas, or are arranged behind any data area. The system information and the status information is programmed into each data area of the page according to the original status information, so as to allow the flash drive to load a data area and an associated redundant area for each access operation with a smaller buffer.

10 Claims, 10 Drawing Sheets

METHOD AND APPARATUS FOR DYNAMICALLY CONFIGURING REDUNDANT AREA OF NON-VOLATILE MEMORY

BACKGROUND OF THE INVENTION

1. Field of the Invention

The present invention relates to a method and an apparatus for dynamically configuring the redundant area in a non-volatile memory and, more particularly, to a method and an apparatus for configuring data areas and redundant areas in a flash memory and reducing the buffer size of the storage device for accessing data.

2. The Related Arts

Flash memory is widely used in versatile digital equipment, such as digital cameras, TV game boxes, and flash drives. As the fabrication technology improves, the capacity of flash memory also increases greatly. For example, FIG. 1 shows the 1G-bit flash memory chip 1 manufactured by Samsung. The flash memory has the capacity of 128M bytes, divided into 1024 blocks 11, with each block having 64 pages 12. In each page 12, there are 2K+64 bytes, where 2K bytes are the data area 121, and the 64 bytes are the redundant area 122, located at the end of the data area 121 for storing system information of the flash memory 1. The system information comprises the flag or the status parameter to indicate whether the data area 121 of the memory block 11 is damaged. The flag or the state parameter is referenced while accessing the flash memory 1.

However, the structure of data area 121 and redundant area 122 in the flash memory 1 cannot be accessed by the conventional flash memory controller because the buffer size of the conventional flash memory controller is too small. In general, the IC designers have to redesign the controller to cooperate with the new flash memory. For example, the conventional controller has a pair of 528-byte ping-pong buffers (total of 1056 bytes) for accessing a memory structure with a 512-byte data area and a 16-byte redundant area. The buffers are unable to accommodate the data area 121 and the redundant area 122 as shown in FIG. 1 (total of 2112 bytes). Therefore, it is necessary to develop a new flash memory controller to access the new flash memory structures, such as the flash memory 1. Thus, the re-development of the FIFO control circuit in the controller and the associated firmware to access the new 2K+64-byte buffer is necessary for the prior art. This does not only take time and high cost but also delay the product's mass production schedule

SUMMARY OF THE INVENTION

The present invention discloses a method for dynamically configuring the redundant area of the non-volatile memory. The new configuration comprises a plurality of data areas and a plurality of redundant areas in each page, where the redundant areas interleave the data areas so that the flash drive buffers with the size of a data area plus a redundant area when accessing the flash memory. The present invention is universally applicable to conventional buffer or hardware circuits designed in the flash drive in order to shorten the development cycle and reduce the development cost.

The present invention also discloses a method for dynamically configuring the redundant areas of a non-volatile memory having a plurality of blocks, with each block having a plurality of pages. The method comprises the steps of: acquiring the original status information of each memory block; configuring each page of each block into a plurality of data areas and a plurality of redundant areas; and programming the status information into the redundant areas according to the original status information.

Furthermore, the present invention discloses a USB flash drive, comprising a flash memory and a USB controller. The USB controller comprises a ROM, preprogrammed with a firmware; a RAM; a buffer unit; a microprocessor, coupled to the ROM, the RAM, and the buffer unit; a serial interface engine; a USB physical layer circuit, for connecting the serial interface engine and the microprocessor; and a direct memory access unit for connecting the buffer unit and the flash memory. The serial interface engine is coupled to the buffer unit. The USB physical layer circuit coupled to the serial interface engine transceives a USB differential signal. The direct memory access unit directly accesses the flash memory. The microprocessor and the firmware cooperate to access a page of the flash memory with a plurality of separate accesses for the data areas of the page.

These and other objects, features and advantages of the invention will be apparent to those skilled in the art, from a reading of the following brief description of the drawings, the detailed description of the preferred embodiment, and the appended claims.

DETAILED DESCRIPTION OF THE PREFERRED EMBODIMENT

Figure 1:
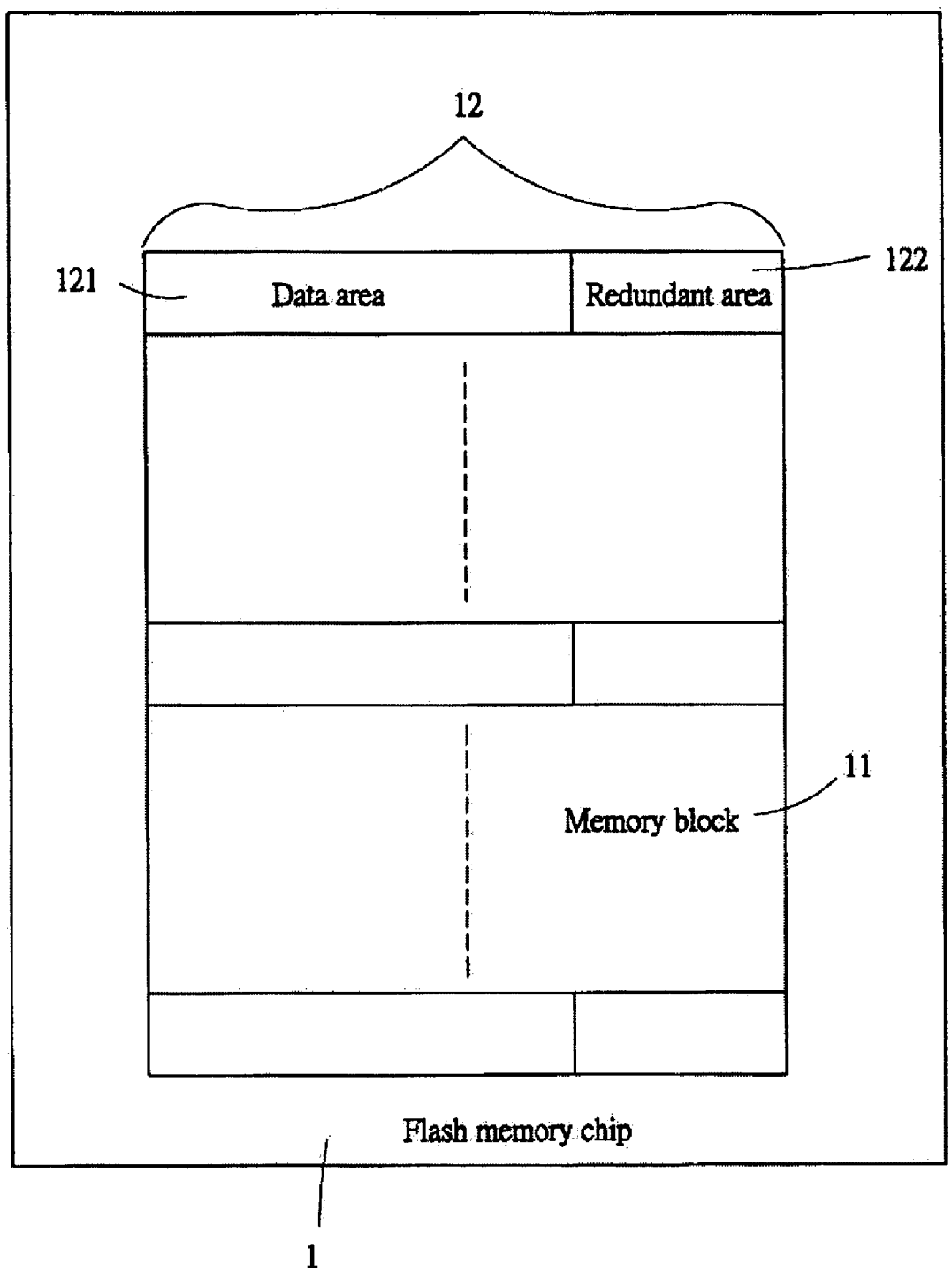
FIG. 1 shows a configuration of a memory page in a flash memory according to the prior art.
Figure 2:
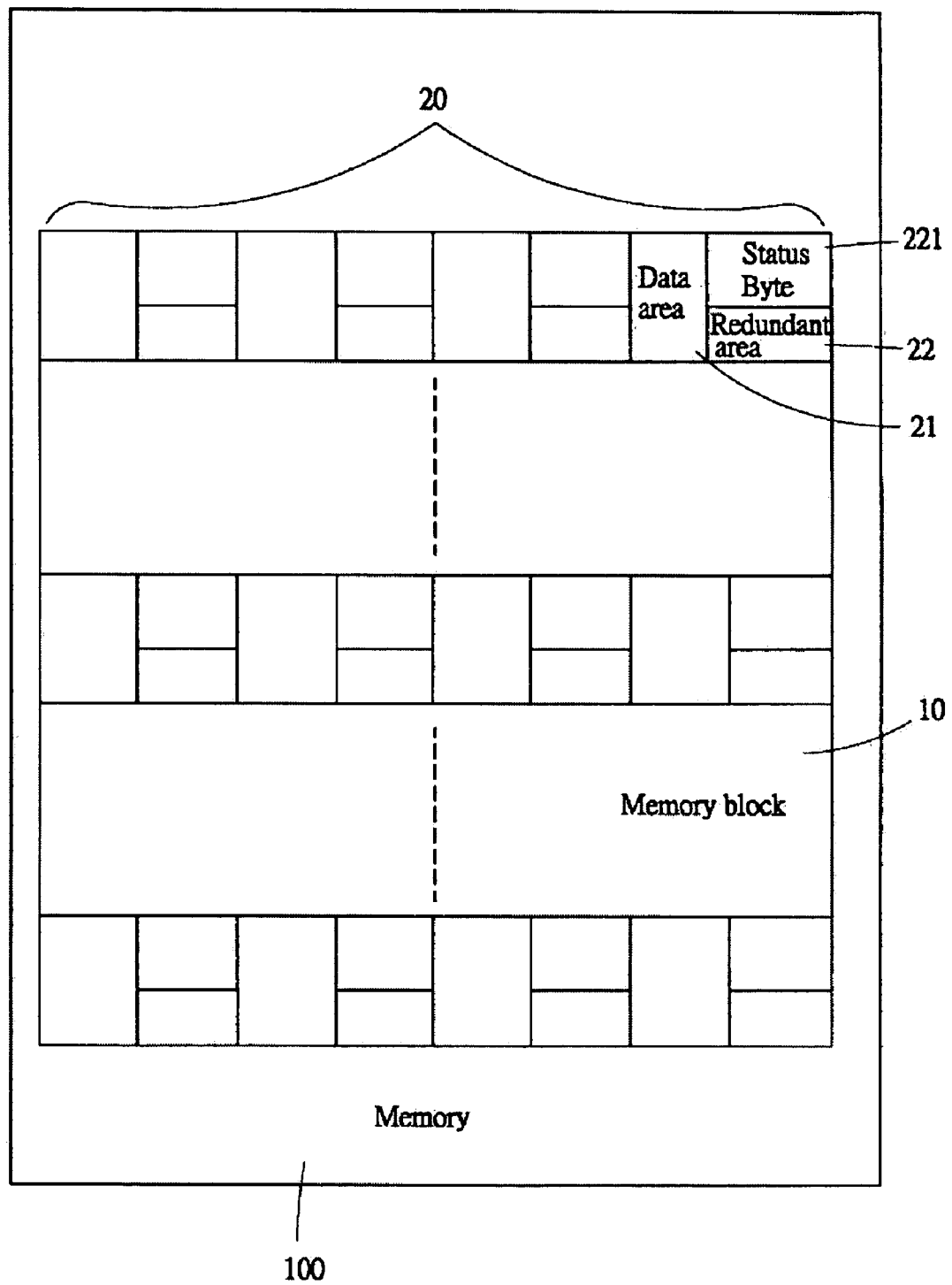
FIG. 2 shows a memory page configuration according to a first embodiment of the present invention.

FIG. 2 shows an exemplary memory page configuration for a memory 100 according to one embodiment of the invention. Take Samsung 128M-byte flash memory as example. At first, the status information of the flash memory is read. The memory 100 comprises 1024 blocks 10, with each block 10 having 64 pages 20, as shown in FIG. 2. Each page 20 is configured to comprise a plurality of consecutive data areas 21 and at least one redundant area 22. In the embodiment shown in FIGS. 2 and 3, there are 4 redundant areas 22. Each page 20 is exemplified as 2112 (=2K+64) bytes. Each data area 21 has 512 bytes, and each redundant area 22 has 16 bytes. Similarly, if each page is configured into 8 data areas 21 and 8 redundant areas 22, the sizes of the data area 21 and the redundant area 22 are 256 bytes and 8 bytes, respectively. The redundant areas 22 preferrably interleave the data areas 21, that is, a redundant area 22 is placed between two consecutive data areas 21. Finally, the status information that was previously read is written to each redundant area 22. With this novel configuration, a controller with a 528-byte ping-pong buffer can burst access a 2112-byte page 20 consecutively with each burst accessing 512+16 bytes. Therefore, by updating the firmware in the flash memory controller, the controller can access a 2112-byte page, or even larger, with a 528-byte ping-pong buffer.

Figure 3:
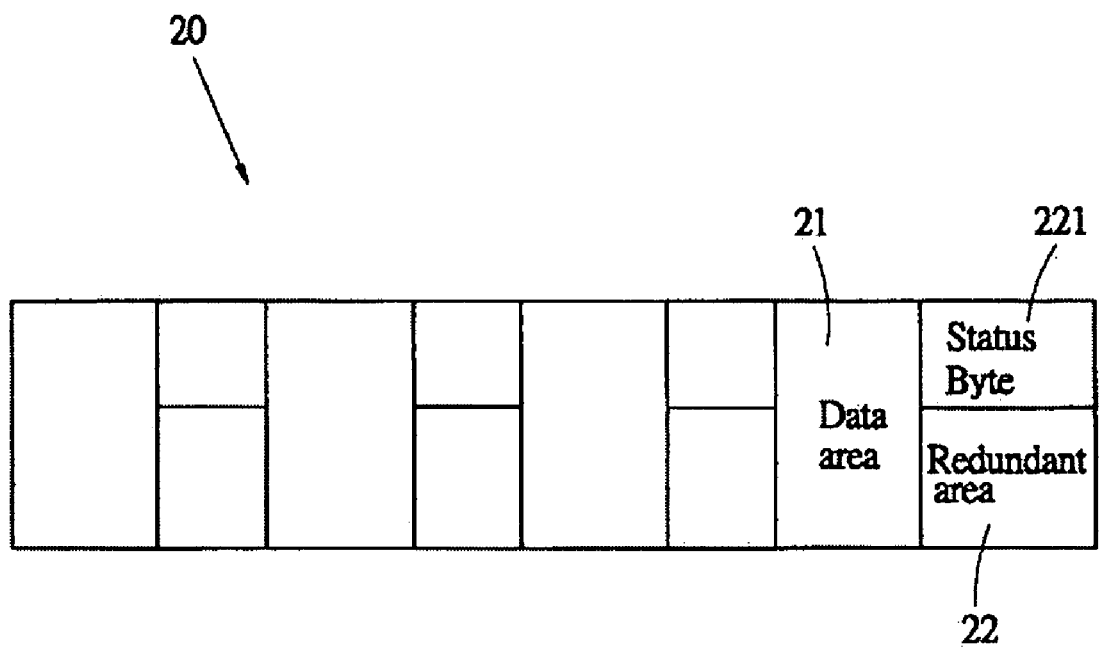
FIG. 3 shows an enlarged memory page in FIG. 2.

The data areas 21 in the page 20 of the memory 100, shown in FIGS. 2 and 3, store data. The system information is generated according to the original status information (not shown) and stored in the redundant area 22. For example, if each page 20 has 2112 bytes, the status information can be allocated at the 2048th byte. There is a status byte 221 in each redundant area 22 for recording this information. According to the information stored in the status byte 221, the status of the blocks 10 and pages 20 of memory 100 can be determined.

Figure 4:
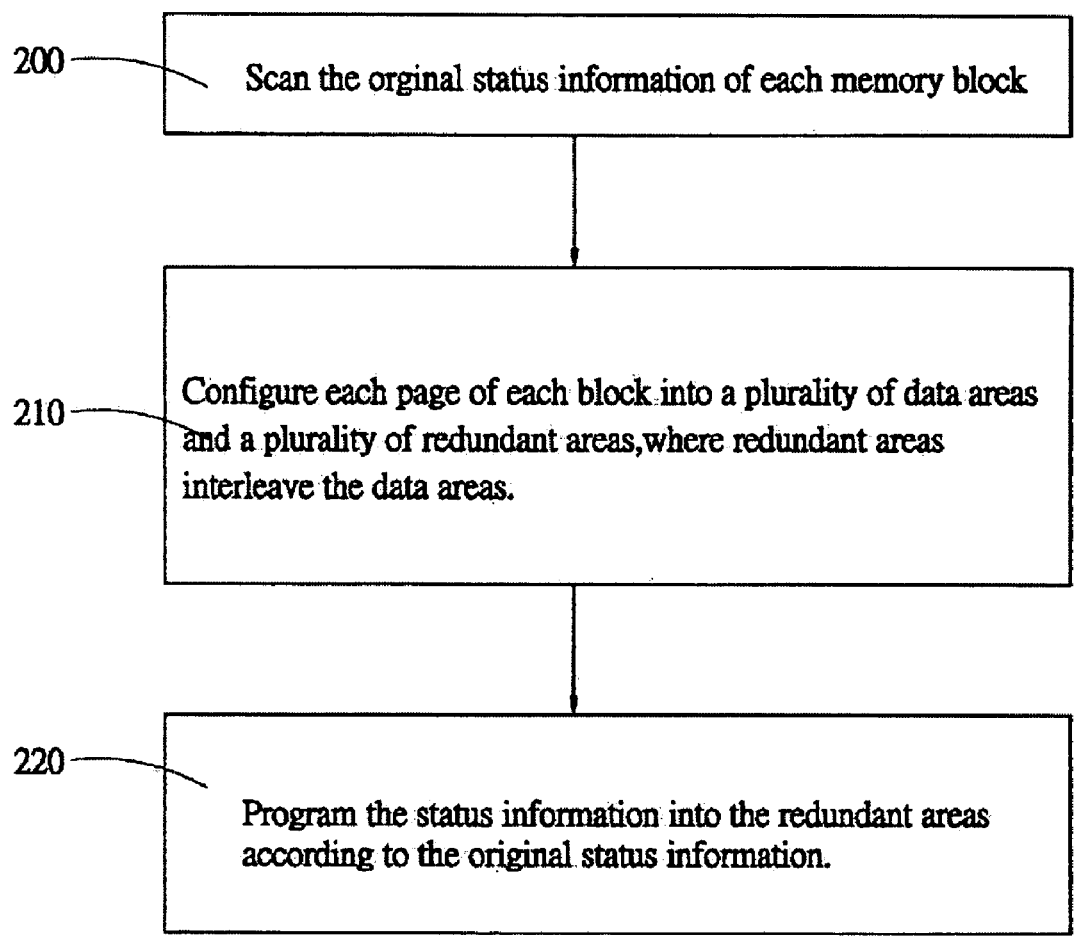
FIG. 4 shows a flowchart of the first embodiment for dynamically configuring the redundant area of the non-volatile memory.

FIG. 4 shows a flowchart for dynamically configuring redundant areas according to the present invention. At step 200, scan the original status information of each memory block. Proceeding to step 210, configure each page of each block into a plurality of data areas and a plurality of redundant areas, where redundant areas interleave the data areas. Next to step 220, program the status information into the redundant areas according to the original status information.

Figure 5:
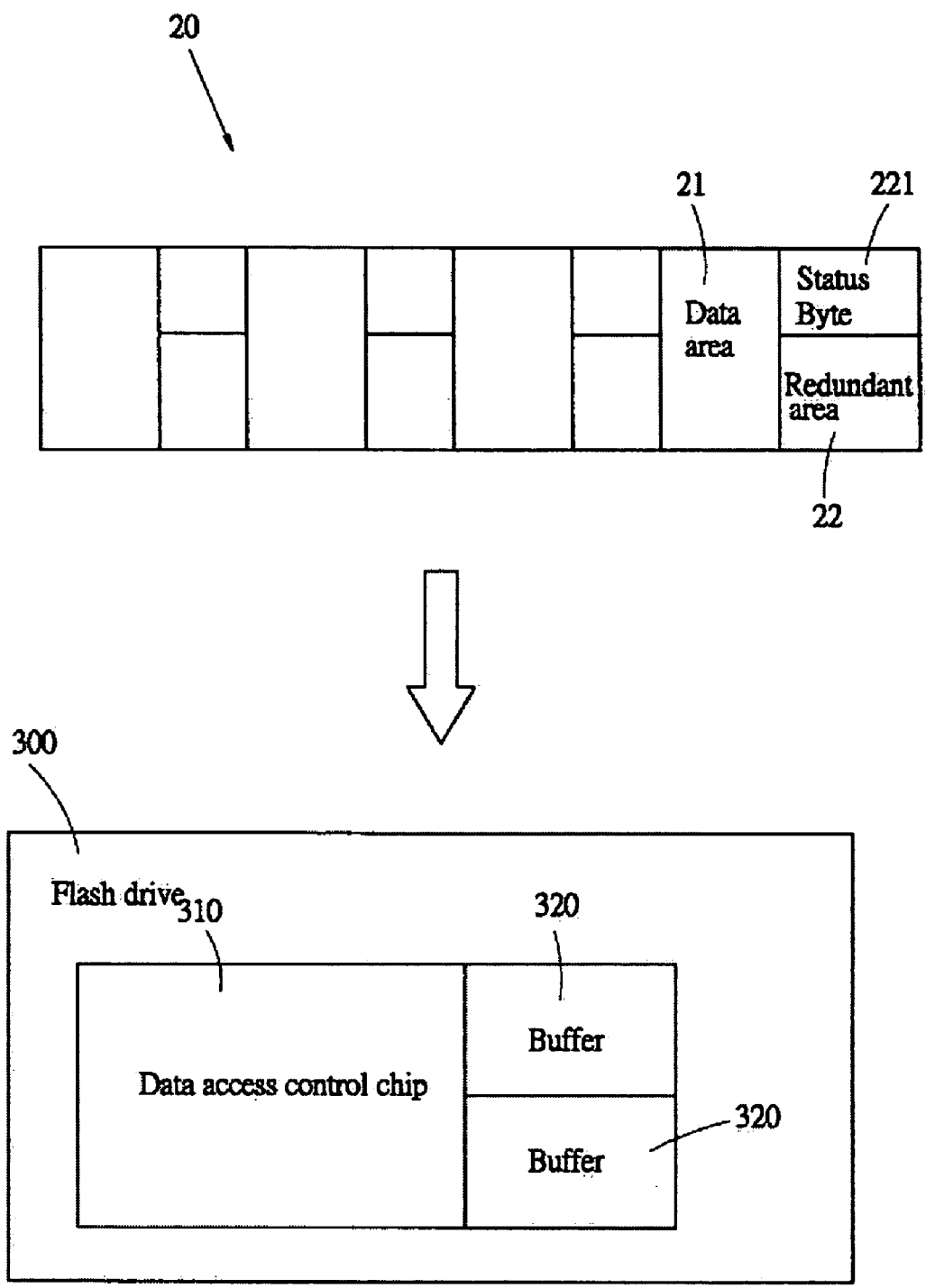
FIG. 5 shows a flash drive according to a preferred embodiment of the present invention.

FIG. 5 shows a flash drive 300 for accessing a non-volatile memory having dynamically configured redundant areas according to the preferred embodiment of the present invention. The flash drive 300 comprises a data access control chip 310 and two buffers 320. In this embodiment, each buffer 320 has 528 bytes. A page 20, as shown in FIG. 2, in the flash drive 300 is read by performing four burst reads for data areas 21 and redundant areas 22 into the buffers 320. After each burst read is performed, the access control chip 310 transfers the data to the host (not shown). In other words, the present invention loads a data area 21 and a redundant area 22 into the buffer 320, thus requiring several bursts to access an entire page 20.

Figure 6:
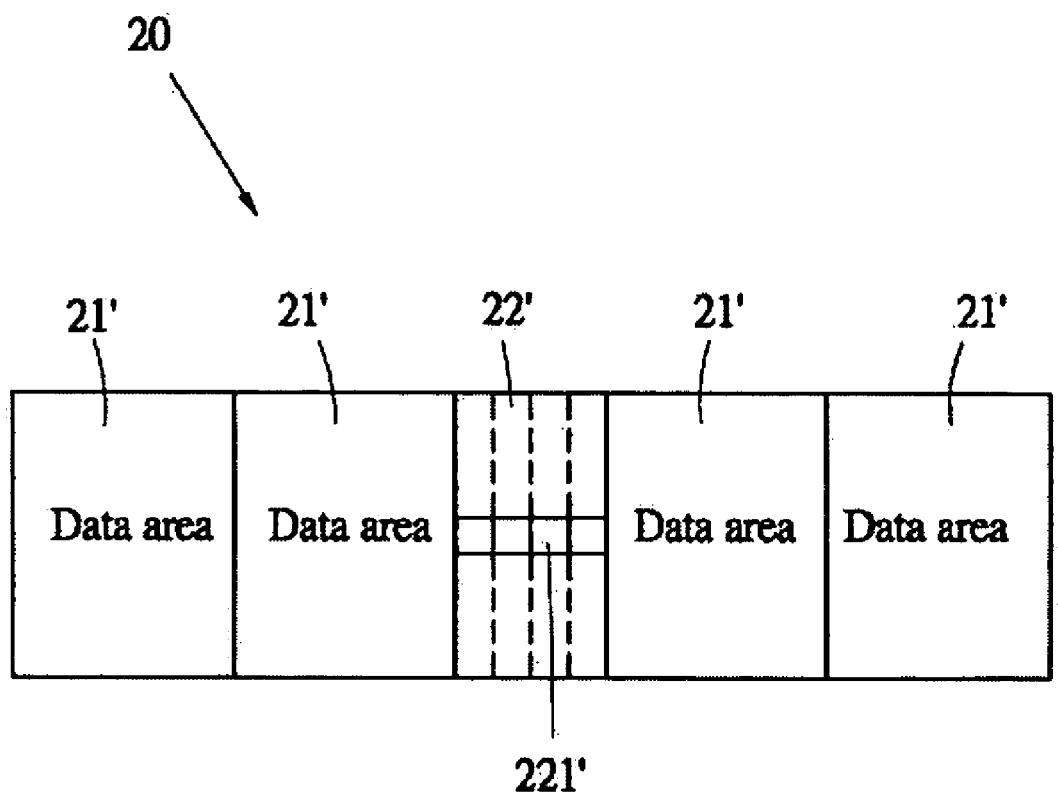
FIG. 6 shows a configuration of a memory page according to another embodiment of the present invention.

FIG. 6 shows a configuration of a memory page according to another embodiment of the present invention. The page 20 is configured into a plurality of data areas 21' and one redundant area 22', with each data area 21' having 512 bytes, and the redundant area 22' having 64 bytes. The redundant area 22' follows one of the data areas 21'. As shown in FIG. 6, the redundant area 22' is positioned between the second data area 21' and the third data area 21'. The first data area 21' is adjacent to the second data area 21', and the third data area 21' is adjacent to the fourth data area 21'. The data areas 21' store general information, while the redundant area 22' has a plurality of status bytes 221' indicating the status of the memory 100.

Figure 7:
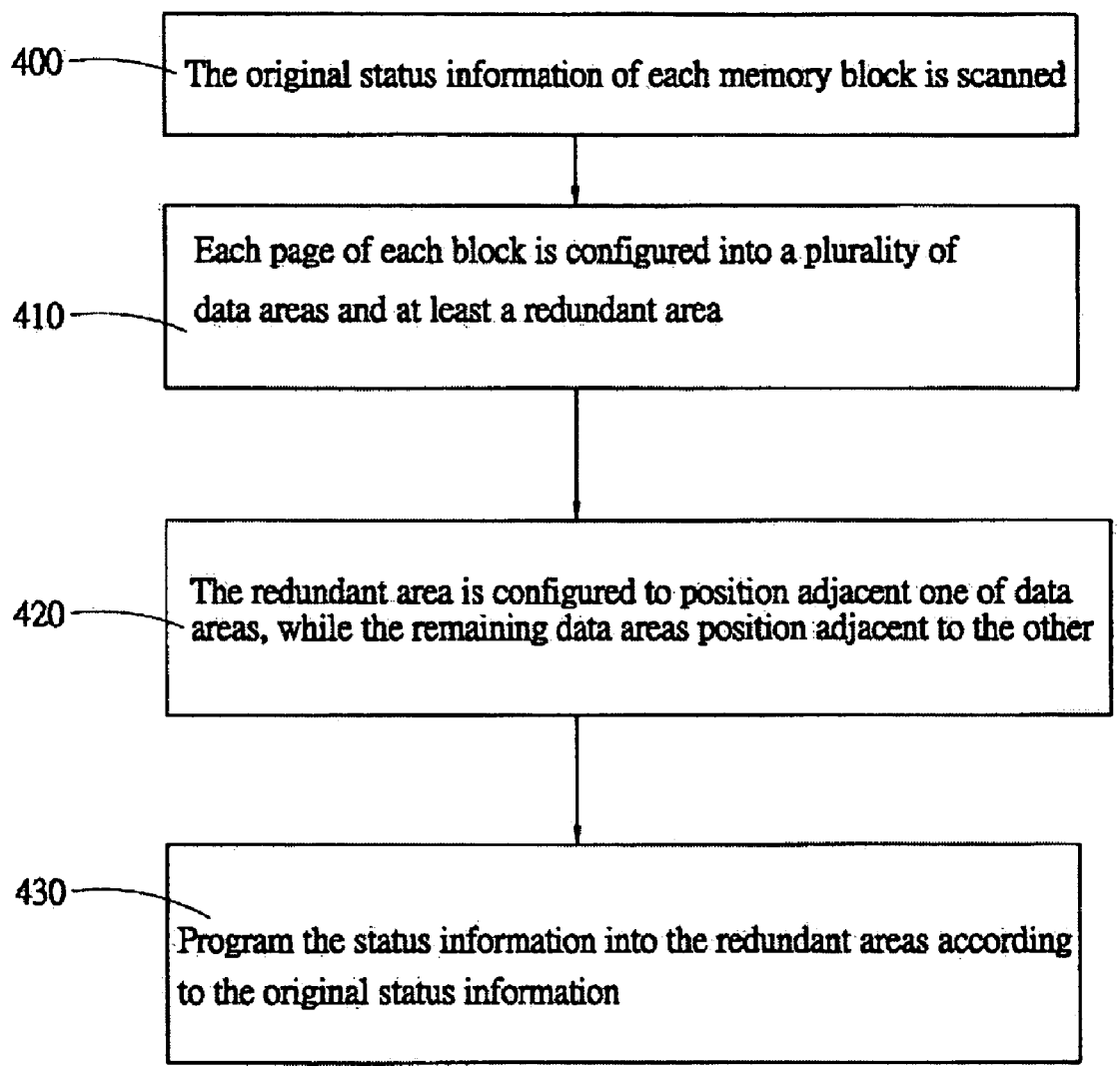
FIG. 7 shows a flowchart of the embodiment in FIG. 6 for dynamically configuring the redundant area of a non-volatile memory.

FIG. 7 shows the flowchart with reference to the memory structure in FIG. 6. At step 400, the original status information of each memory block is scanned. At step 410, each page of each block is configured into a plurality of data areas and at least a redundant area. At step 420, the redundant area is configured to position adjacent one of data areas, while the remaining data areas position adjacent to the other. At step 430, program the status information into the redundant areas according to the original status information.

Referring to the memory page 20 shown in FIG. 6 and the flowchart disclosed in FIG. 7, the memory page 20 is read in five separate times, sequentially including data area 21', data area 21', redundant area 22', data area 21', and data area 21'. Therefore, accessing a larger memory page utilizing a smaller buffer is also achieved according to the present invention.

Figure 8:
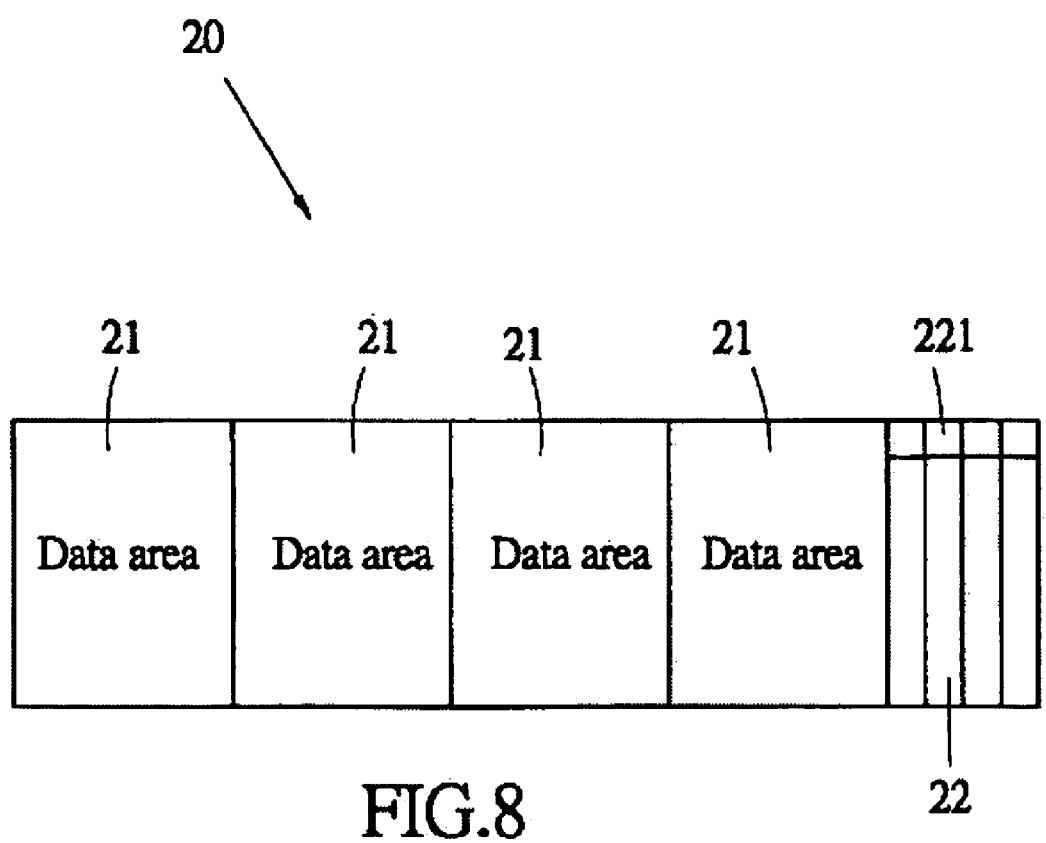
FIG. 8 shows a configuration of a memory page according to yet another embodiment of the present invention.

FIG. 8 shows a configuration of a memory page according to yet another embodiment of the present invention. The memory page 20 is configured into a plurality of data areas 21 and a plurality of redundant areas 22. The data areas 21 are all arranged adjacently, and the redundant areas 22 follow the last data area 21. The redundant areas are also positioned adjacent to each other. The data areas 21 store general information, while the redundant areas 22 store system information of the memory 100.

Figure 9:
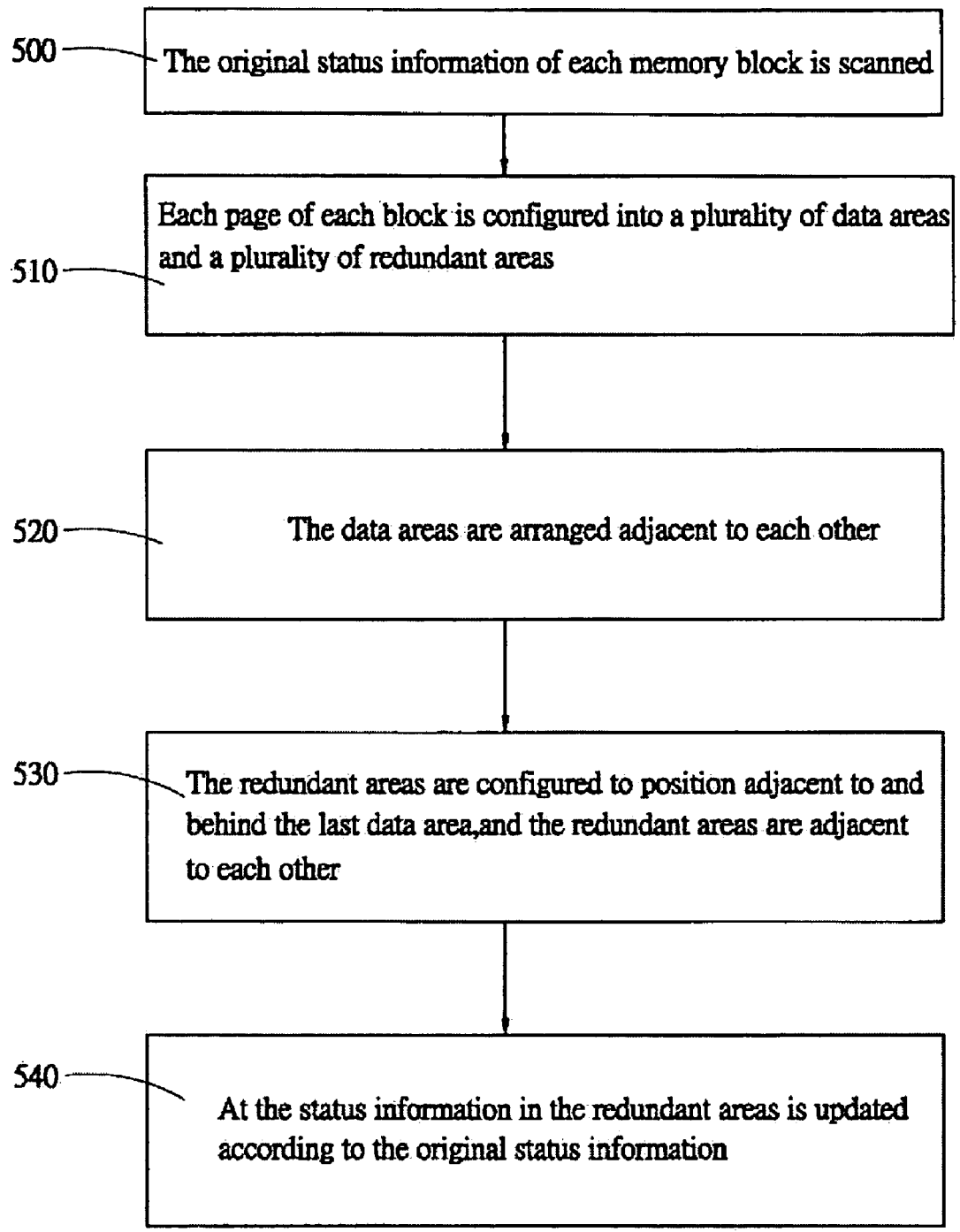
FIG. 9 shows a flowchart for dynamically configuring the redundant area of a non-volatile memory with reference to the memory page structure in FIG. 8.

FIG. 9 shows a flowchart for dynamically configuring the redundant area of a non-volatile memory with reference to the memory page structure in FIG. 8. At step 500, the original status information of each memory block is scanned. At step 510, each page of each block is configured into a plurality of data areas and a plurality of redundant areas: At step 520, the data areas are arranged adjacent to each other. At step 530, the redundant areas are configured to position adjacent to and behind the last data area, and the redundant areas are adjacent to each other. At step 540, the status information in the redundant areas is updated according to the original status information.

With reference to FIGS. 8 and 9, a memory page is read in four burst reads, sequentially including data area 21 plus redundant area 22, data area 21 plus redundant area 22, data area 21 plus redundant area 22, and data area 21 plus redundant area 22. That is, 528 bytes are read each time. Therefore, a controller with a smaller buffer is capable of accessing a large memory page according to the present invention.

Figure 10:
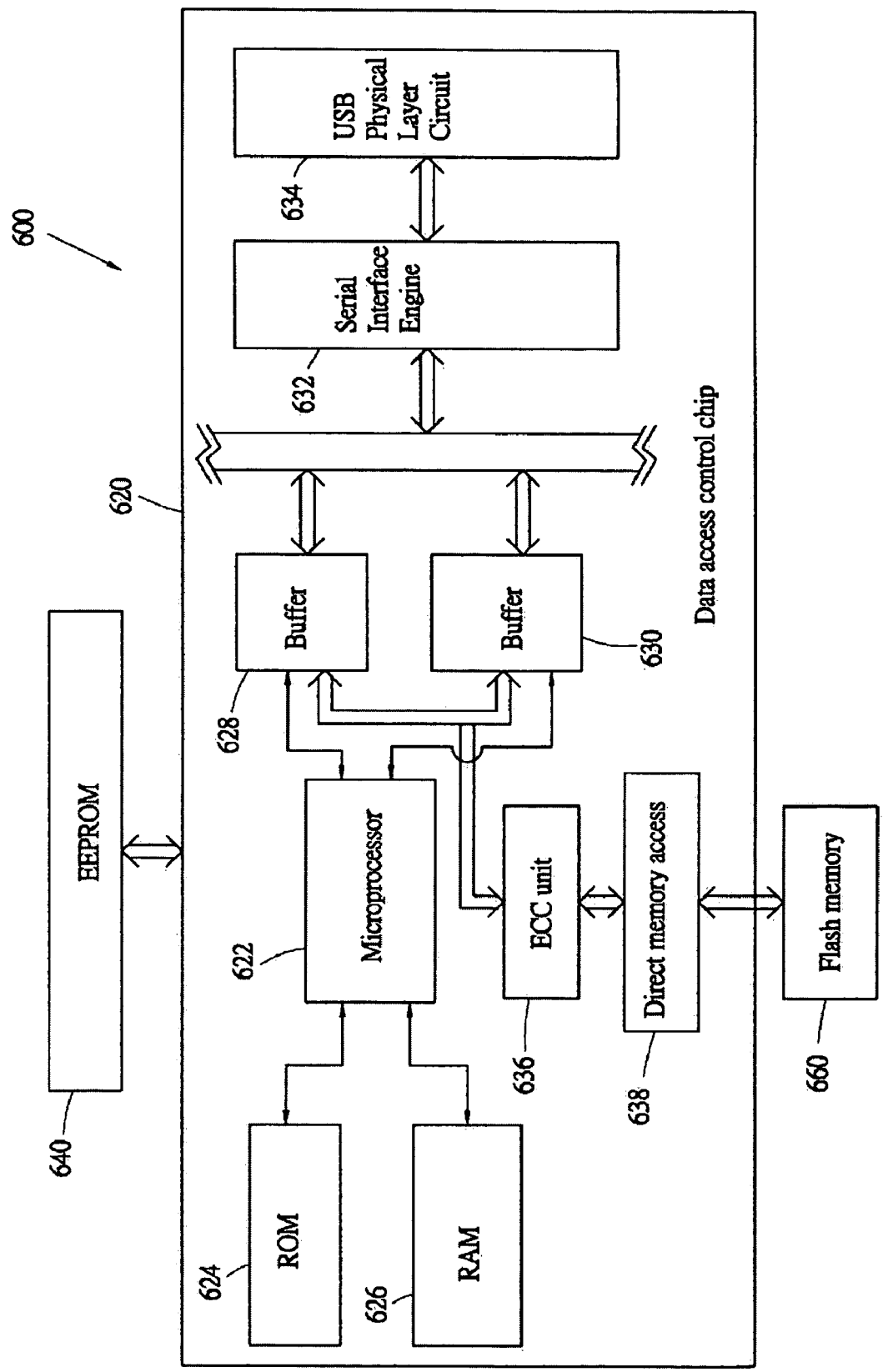
FIG. 10 shows a block diagram of a flash drive capable of dynamically configuring the redundant area of non-volatile memory according to the present invention.

FIG. 10 shows a block diagram of a flash drive 600 with dynamically configured redundant area of non-volatile memory according to one embodiment of the present invention. The flash drive 600 comprises a data access control chip 620, an EEPROM 640, and a flash memory 660. The data access control chip 620 is coupled to the EEPROM 640 and the flash memory 660. The EEPROM 640 stores the basic setting of the flash drive 600 which is loaded when the flash drive 600 is powered on. The data access control chip 620 is capable of accessing the flash memory 660. The data access control chip 620 comprises a microprocessor 622, a ROM 624, a RAM 626, two 528-byte buffers 628, 630, a serial, interface engine 632, a USB physical layer circuit 634, an error correction code (ECC) unit 636, and a direct memory access (DMA) 638. The ROM 624 recording firmware cooperates with the microprocessor 622. The microprocessor 622 is coupled to the ROM 624, the RAM 626, and the two buffers 628, 630 for cooperation. The two 528-byte buffers 628, 630 form the dual buffer structure for ping-pong buffering. The buffers 628, 630 are coupled to the ECC unit 636 and the serial interface engine 632. The serial interface engine 632 is coupled to the USB physical layer circuit 634 for generating USB-complied signal. DMA 638 coupled to the ECC unit 636 performs direct memory accesses to the flash memory 660. The firmware in the ROM 624, operating with the two buffers 628, 630, performs steps disclosed in FIG. 3 to achieve accessing the flash memory 660 having the larger memory pages utilizing a smaller ping-pong buffer structure with low-cost. In this embodiment, the 528-byte buffers are capable of accessing a 2K+64-byte page of a flash memory according to the invention. Moreover, the 256-byte buffers can also be applied to access a page of a flash memory with multiple bursts. Thus, the gate count in the control chip is reduced.

Therefore, the present invention of the flash memory controller can access the new flash memory 100 by updating the firmware without redesigning the hardware. Thus, the time and the cost for developing a new hardware is reduced.

In summary, the present invention discloses a method for dynamically configuring the redundant areas of a non-volatile memory having a plurality of blocks, with each block having a plurality of pages. The method comprises the steps of: acquiring the original status information of each memory block; configuring each page of each block into a plurality of data areas and a plurality of redundant areas; and programming the status information into the redundant areas according to the original status information.

The present invention also discloses a USB flash drive, comprising a flash memory and a USB controller. The USB controller comprises a ROM, preprogrammed with a firmware; a RAM; a buffer unit; a microprocessor, coupled to the ROM, the RAM, and the buffer unit; a serial interface engine; a USB physical layer circuit, for connecting the serial interface engine and the microprocessor; and a direct memory access unit for connecting the buffer unit and the flash memory. The serial interface engine is coupled to the buffer unit. The USB physical layer circuit coupled to the serial interface engine transceives a USB differential signal. The direct memory access unit directly accesses the flash memory. The microprocessor and the firmware cooperate to access a page of the flash memory with a plurality of separate accesses for the data areas of the page. The system information and the status information is programmed into each data area of the page according to the original status information, so as to allow the flash drive to load a data area and an associated redundant area for each access operation with a smaller buffer.

While the invention has been described in connection with what is presently considered to the most practical and preferred embodiment, it should be understood that the invention is not intend to be limited to the disclosed embodiment, but on the contrary, is intended to cover various modifications and equivalent arrangement included within the spirit and scope of the appended claims.

What is claimed is:

1. A method for dynamically configuring a plurality of data and redundant areas of a non-volatile memory for data transfer to a buffer of predetermined size, said non-volatile memory comprising a plurality of blocks, with each block having a plurality of pages and each page being of a greater size than said predetermined size of said buffer, said method comprising: reading an original status information of each memory block;

configuring each page of each block into a plurality of data areas and a corresponding plurality of redundant areas, said configured data areas each having a size equal to or less than said predetermined size of said buffer and a sum of the size of each of said plurality of redundant areas being equal to or less than said predetermined size of said buffer; and programming the status information in the redundant areas according to the original status information.

2. The method as claimed in claim 1, wherein said configuring step further comprises interleaving said redundant areas with said data areas, a sum of bytes of a respective data area and a corresponding redundant area being equal to said predetermined size of said buffer.

3. The method as claimed in claim 1 further comprising a step of accessing each page of each of said blocks with a series of separate accesses for each of said data areas and corresponding redundant areas of said page.

4. The method as claimed in claim 1, wherein said non-volatile memory is a flash memory.

5. The method as claimed in claim 1, wherein said configuring step comprises allocating said redundant areas adjacently and allocating said data areas behind said redundant areas.

6. The method as claimed in claim 1, wherein each page comprises four data areas and four associated redundant areas.

7. A method for dynamically configuring data and redundant areas of a non-volatile memory for data transfer to a buffer of predetermined size, said non-volatile memory comprising a plurality of blocks, with each block having a plurality of pages and each page being of a greater size than said predetermined size of said buffer, said method comprising the steps of:

configuring each page into a plurality of data areas and a plurality of redundant areas, said configured data areas each having a size equal to or less than said predetermined size of said buffer and a sum of the size of each of said plurality of redundant areas being equal to or less than said predetermined size of said buffer;

interleaving said redundant areas with said data areas of each page; and programming a status information into each redundant area.

8. The method as claimed in claim 7, wherein said redundant areas interleave with said data areas, a sum of bytes of a respective data area and a corresponding redundant area being equal to said predetermined size of said buffer.

9. The method as claimed in claim 7 further comprising a step of accessing each page of each of said blocks with a series of separate accesses for each said data areas and corresponding redundant areas of said page.

10. The method as claimed in claim 7, wherein each page comprises four data areas and four redundant areas.

* * * * *